United States Patent [19]

Swainson

[11] 4,041,476
[45] Aug. 9, 1977

[54] METHOD, MEDIUM AND APPARATUS FOR PRODUCING THREE-DIMENSIONAL FIGURE PRODUCT

[76] Inventor: Wyn Kelly Swainson, P.O. Box 4262, Berkeley, Calif. 94704

[21] Appl. No.: 165,042

[22] Filed: July 23, 1971

Related U.S. Application Data

[63] Continuation-in-part of Ser. No. 744,027, July 11, 1968, abandoned.

[51] Int. Cl.² .............................................. G11C 13/04
[52] U.S. Cl. ......................... 340/173 CC; 340/324 R; 364/900; 358/113; 358/302
[58] Field of Search ............... 178/6.5, 6.6 R, 6.6 B, 178/6.7 R; 340/324 R, 173 CC, 172.5

[56] References Cited
U.S. PATENT DOCUMENTS

| 1,923,208 | 8/1933 | Howey | 178/6.6 B |
|---|---|---|---|
| 2,543,793 | 3/1951 | Marks | 178/6.5 |
| 3,123,711 | 3/1964 | Fajans | 340/173 CC |
| 3,134,297 | 5/1964 | Carlson et al. | 340/173 CC |
| 3,466,616 | 9/1969 | Bron et al. | 340/173 CC |
| 3,474,248 | 10/1969 | Brown et al. | 340/173 CC |
| 3,518,367 | 6/1970 | Smith | 178/6.7 R |
| 3,541,542 | 11/1970 | Duguay | 340/324 R |
| 3,609,707 | 9/1971 | Lewis | 340/173 CC |
| 3,636,250 | 1/1972 | Haeff | 178/6.5 |
| 3,636,551 | 1/1972 | Maguire | 178/6.5 |

Primary Examiner—Stuart N. Hecker
Attorney, Agent, or Firm—Townsend and Townsend

[57] ABSTRACT

Method, apparatus and product in which a three-dimensional figure is formed in situ in a medium having two active components by causing two radiation beams to intersect in the media. The dissimilar components are selected to respond to the simultaneous presence of the beam and to either react or to produce reactants which render the intersection of the beams physically sensible or distinguishable. The beams trace surface elements of the figure to be produced.

72 Claims, 6 Drawing Figures

INVENTOR.
Wyn Kelly Swainson

METHOD, MEDIUM AND APPARATUS FOR PRODUCING THREE-DIMENSIONAL FIGURE PRODUCT

CROSS REFERENCE TO RELATED APPLICATIONS

This application is a continuation-in-part of my co-pending Ser. No. 744,027, filed July 11, 1968, entitled METHOD OF PRODUCING A THREE-DIMENSIONAL FIGURE, now abandoned.

BACKGROUND OF THE INVENTION

The present invention is directed to method and apparatus for producing three-dimensional figures in a suitable three-dimensional volume filled with a liquid, solid, or gaseous medium in which use is made of certain parameters of electromagnetic radiation in conjunction with selected reactive components of a novel application within the medium.

Two-dimensional figures can be drawn by hand or machine, they can be reproduced identically or enlarged by optical processes such as photography, which processes also allow large numbers of copies to be made. Such figures can be transmitted by wire or television means. Prior to the present invention there have been no practical means by which figures conceived in three dimensions can be easily made visible or real by unskilled persons. Architecture and sculpture are limited professions requiring a rare combination of visualising capacity and mechanical skill. In contrast to the facility with which two-dimensional figures can be reproduced, generated, and transmitted, the techniques available for the similar hadling of three-dimensional figures are at best exceedingly primitive. Reproduction of a few three-dimensional objects is possible by means of casting, but not if the original is fragile, and even in the common case of solid stone sculpture it is not possible to produce a copy of altered size without essentially recreating the piece by hand operations. Dynamic displays of three-dimensional information have not been previously possible. In general the present invention allows the creation ad manipulation of figures in three dimensions with an ease and simplicity which transforms many areas of technology.

It is a general object of the invention to provide a method and apparatus for the production of true three-dimensional figures.

It is a particular object of the invention to produce real free-standing isolatable objects in which the shaping of all sides is possible. This use provides a new alternative method for generating new shapes corresponding to a description as well as for producing large numbers of glass or plastic objects without the need for moulds or machining operations.

Another object of the invention is to provide a simple and rapid means and method for the copying of three-dimensional originals on a scale different from the original.

Another object is to provide permanent, static, visible three-dimensional figures, as for display, within a transparent matrix.

A further object of the invention is to provide three-dimensional moving figures within a transparent body in which the movement may be real or apparent.

Another object is to provide a three-dimensional optical memory store for computer applications with the advantage of rapid operation and large volume data capacity.

Another object of the invention is to provide a method and means for production of three-dimensional figures from a description of the essential properties thereof, operating through an appropriate input data source, such as a computer.

A still further object is to provide moulds or models from which moulds may be made for reproduction of objects on the original or altered scale by conventional casting means.

In accordace with these objects, method and apparatus are provided for producing a three-dimensional figure in a volume of medium which includes an intimate mixture of at least two components selectively sensitive to dissimilar parameters of electromagnetic radiation. The medium is exposed to two beams of radiation guided in response to an image description and having dissimilar electromagnetic parameters matched to the medium. In this manner, the path of a first beam with a first parameter activate upon the first component to form a first non-imaging active region while the path of a second beam with a second parameter activates on the second or resulting component to form a three-dimensional real image element in the medium corresponding to the element of image description.

Certain glasses developed by Corning Company provide both transitory and permanent visible figures in combination with a solubility differential. Such glasses are suitable for both transitory and permanent figures in some applications, but in general a wide arrange of properties is available in the plastics-type materials. Transitory figures can also be obtained utilizing media incorporating thermochromic or photochromic elements, such as fulgides, spiropyrans, xanthylidene anthrones and beta-TKN. They can be used with dissimilar beam imaging in which one beam provides an appropriate light affect, while the other beam provides a heat or melting affect which renders the incorporated element active at the intersection image locus. The color change is fixed by resolidification and if desired the figures can be wholly or partially erased by directing the appropriate light on to them.

In general, the apparatus for forming the three-dimensional figure includes an image description means for developing the co-ordinates of its surface as by scanning an original object or a computer or console which translates an arbitrary input description into such co-ordinates. Means are provided for forming electromagnetic beams and for guiding them in response to the description means which causes the beams to intersect at an image element within the medium.

An important aspect of the invention has been the development of novel two-stage active photosensitive systems with new properties making them suitable for the formation of true three-dimensional figures. As the terms are used here, one-stage and two-stage refers to the number of steps required for complete information input, resulting in the formation of a true three-dimensional figure in the case of two-stage systems, whereas conventional one-stage systems are limited to two-dimensional representation.

Three-dimensional figure formation utilizing the two-stage active systems of this invention occurs through the controlled action of at least two guided dissimilar beams of radiation, each selected to be reactive with only the primary or the secondary mechanism of the two-stage reactive system. The two-stage reactive systems preferred for use in this invention can be classified in two groups. Class I systems comprise those in which the medium is formulated with two distinct sensitive components which are selectively and differentially responsive to the particular beam radiations used. In Class II systems only one of the sensitive components is initially incorporated within the medium, this component generating in situ after stimulation by the primary beam the second component which is sensitive selectively only to the secondary beam. In both types of system figure formation occurs exclusively in that region of the medium which has been stimulated by both the primary and the secondary beam. Configuration of the figure is established by construction, usually manipulating the position of the region of intersection and/or its shape in conformity with the three-dimensional co-ordinates of the surface of a hypothetical object, or alternatively determining co-ordinates of a figure to be copied through scanning the surface of that figure.

Instead of using a means such as a hologram to produce simultaneously a multitude of intersections constituting a figure producing image, it is also possible to produce such a figure by the scanning action of an image point, line, or shape over a finite period of time. This active image can be produced through the linked movement of at least two beams guided in passing through the medium such that their intersection traces the image. Such an active image may be provided, for example, by a lens such as a point focus, or it may be produced by the projection of individually guided beams guided so as to intersect at the proper place and time within the medium. Useful beams could theoretically comprise a single wave of electromagnetic energy, for example, light, or multiples of these may be used to generate a variety of beam cross sections so as to produce a flat or curve with which the other intersects. Adaptations of this type are of particular value with certain fluorescent and photochromic media in which the action of a beam of one type is to stimulate a visible change and a second beam of another type is used to quench, suppress or reverse that change throughout the length of the first beam, with the exception of the point or points which are desired to form the figure region.

The following table I lists a number of examples of Class I and Class II systems or media which are set forth together with the type of radiation by which they are activated. The table also explains the mechanism of figure formation. For clarity, references to the table will be made in the claims by including bracketed item numbers, as (3).

TABLE I

| No. | 1st Component | beam | 2nc Component | beam | Other Reactants (O.R.) | Figure Type | Mechanism of Figure Formation |
|---|---|---|---|---|---|---|---|
| (1) | Diazosulphonate or diazosulphinate | UV | Diazo coupler former | IR or VIS-IBLE | Alkali Catalyst | atatic visible multi-colored | An active diazo compound is liberated from the inactive diazosulphonate by Beam I; Beam II liberates a color-generating coupler compound (azo-dye is formed). By use of different coupler generators sensitive to various wavelengths multi-colors can be obtained. |
|  | Active diazo |  | Coupler |  | Class I |  |  |
| (2) | Alkali Liberator (like hexaminocobaltic cl.) | IR or VIS-IBLE | Diazo coupler former | UV | A. N-nitroso-n-aryl-amide | static visible | Formation of alkali (beam I) catalyses rearrangement of O.R. to a form giving a dye with the coupler generated by beam II. The material can be fixed by exposure to wavelengths which destroy the O.R.'s |
|  | Alkali |  | Coupler |  | Class I |  |  |
| (3) | Photosensitive acid former (CBr₄, etc.) | UV or VIS-IBLE | Light Produced oxidiser + O.R. | UV VIS-IBLE or IR | Polymethyl isopropenyl ketone (P.M.I.K.) Hydrogen donor | static visible | Image region containing P.M.I.K. and acid catalyst (Beam I) plus dye Oxidiser (Beam II) and hydrogen sensitiser (O.R.) gives fast dye formation on heat development. |
|  | Acid Catalyst |  | Latent image developable by heat |  | Class I |  |  |
| (4) | Photosensitive acid former (CBr₄, etc.) | UV or VIS-IBLE | Acid catalyst + O.R. | IR or VIS-IBLE | P.M.I.K. Oxidiser | static visible | Beam I alters absorption in path; Beam II strongly absorbed in that path generates heat to develop colored figure. |
|  | Acid catalyst |  | Gives dye |  | Class II |  |  |
| (5) | Photosensitive acid former (HBr₄, etc.) | UV VIS-IBLE | Light produced hydrogen donor plus O.R. | UV VIS-IBLE or IR | P.M.I.K. oxidiser | static visible | Image region containing P.M.I.K. and acid catalyst (Beam I) plus hydrogen sensitiser (Beam II) and oxidiser (O.R.) gives fast dye formation on heat development. |
|  | Acid catalyst |  | Latent image developable by heating |  | Class I |  |  |
| (6) | Photosensitive acid former CBr₄, etc. | UV or VIS-IBLE | Photo-oxidiser | UV VIS-IBLE IR | Polystyrene Ph indicator | static visible | The indicator dye (O.R.) and acid (Beam I) with oxidiser (Beam II) give colored dye |
|  | Acid catalyst |  | velopable by heat |  | Class I |  |  |
| (7) | p-thiolstyrene monomer + mild poly-meri-zation UV | | Yellow photoreducible dye Vis- | Blue | | Insol. polymer free radicals. Beam II crosslinks the | Beam I partially polymerises the thiol monomer through generation of |
|  | cat. | IR |  | ible |  |  | polymer by oxidation of the thiol groups on neighboring polymer molecules. Precipitated polymer forms image figure. |
|  | Soluble thiol polymer Photoactivated weak electron donor | UV VIS- | Cross-linked insoluble polymer Photoreducible dye | UV | Class II Gelatine bichromate system | insol. polymer | Available electrons (Beam I) reduce the photoexcited dye (Beam II); the reduced dye then reduces the hexa- |

TABLE I-continued

| | Active System | | | | Class of media | | |
|---|---|---|---|---|---|---|---|
| No. | 1st Component | beam | 2nd Component | beam | Other Reactants (O.R.) | Figure Type | Mechanism of Figure Formation |
| (8) | reducing potential dye but not for metal ion | IBLE IR | Reduced dye is capable of reducing metal ion (O.R.) | VIS-IBLE | | | valent chromium giving a water-insoluble figure |
| (9) | Photoactivated weak electron donor reducing potential for dye but not for metal ion | UV IBLE IR | Photoreducible dye capable of reducing metal ion (O.R.) | UV VIS-IBLE IBLE | Class I polyacrylamide + Hg chloride or titanic Lactate System | Figure liquefies in solid matrix | Available electrons (Beam I) reduce the photoexcited dye (Beam II) the reduced dye then reduces the mercuric or the titanium ion causing collapse of the polymer gel. |
| (10) | Photoactivated weak electron donor reducing potential for dye | UV VIS-IBLE IR | Photoreducible dye Reduced dye | UV VIS-IBLE | Class I cross-linking agent vinyl monomer | insol. polymer | Photoreduction of the dye (Beam II) in presence of the electron donor generated by Beam I induces polymerisation. |
| (11) | Ferric Ammonium Citrate Ferrous ion | UV VIS-IBLE | Diazo light sensitive oxidiser Oxidant | UV | Class I Acrylamide N,N'methylonebisacrylamide Gelatine | insol. polymer | The photoreducible iron salt is reduced to the ferrous ion by Beam I; Beam II generates oxidising agent which reconverts the ferrous ion to ferric and in the process generates free radicals which induce polymerisation. |
| (12) | Phenothiazino dye strong oxidising potential | VIS-IBLE | p-nitrophenyl acotate aci-ions | UV | Class I salts of aromatic sulfinic acids | insol polymer | Photoexcited dye (Beam I) oxidises the catalyst (O.R.) giving polymerization stimulating radicals. U.V. Beam II inhibits polymerisation (negative beam effect) along path of Beam I, except where figure formation (by precipitation of polymer) is desired. |
| (13) | Diazosulphonate or sulphinate free diazo compound | UV or VIS-IBLE | Light sensitive alkali liberator alkali | VIS-IBLE IR | Class I | insol. polymer | The inactive diazosulphonate or sulphinate is decomposed to active diazo by Beam I; the alkaline condition required for polymerization is generated by Beam II. |
| (14) | Diazosulphonate or sulphinte active diazo (oxidising agent) | UV | Various blue sensitising dyes activated dye (electron donor) | VIS-IBLE RED | Class I Vinyl or Vinylidene monomer | insol. polymer | The polymerisation catalysing diazo is liberated from the sulphonate complex by Beam I; activation of the dye by Beam II induces polymerisation where the free diazo is present |
| (15) | Benzophenone-type poly. cat. polymer | VIS-IBLE | benzoin-type polymerization catalyst polymer | UV | Class I polymers with -OH- or thiol-side groups | insol. polymer | Synergism between the two catalyst types gives rise to a rate of polymerization (cross-linking) much more than simple addition. The beams are selected each to be primarily absorbed by only one of the catalyst types. |
| (16) | Photo-oxidant oxidiser | VIS-IBLE | Slowly autooxidised hydrazone alpha-azo-hydroperoxide | UV | Class I | insol. polymer | Beam I generates an oxidant to convert the hydrazone to photopolymerisation catalysing alpha-azohydroperoxide, which is activated by Beam II. |
| (17) | Photosensitive Radical former (CBr$_4$, etc.) Radicals | near UV | in situ formed latent image absorbs infrared Color dye | IR | Class II N-vinylamines chain paraffin hydrocarbon | static visible | Free radicals (Beam I) induce very rapid formation of a latent image along path; development of color is carried out by absorption of Beam II by latent image in path of Beam II. |
| (18) | Diazo coupler former Coupler | UV VIS-IBLE | in situ formed coupler + O.R. Colored dye | diamine UV | Class II p-phenylene visible organic azido compound | static azido compounds effect oxidative multicolored Couplers give multicolored figures. | U.V. illuminated (Beam II) organic condensation of p-phenylenediamine color developing agent with coupler formed by Beam I. Various |
| (19) | Light sensitive peroxide former | UV VIS-IBLE IR | in situ formed peroxide + O.R. | UV 3000 4000 | Class II Gold salt with styrene alkyd | static visible | Styrene alkyd resin plus gold salt is a photosensitive dye-former in presence of peroxide formed by Beam I. |

TABLE I-continued

| No. | 1st Component | Active System beam | 2nc Component | beam | Class of media Other Reactants (O.R.) | Figure Type | Mechanism of Figure Formation |
|---|---|---|---|---|---|---|---|
| | Peroxide | | Dye | A | resin Class II | | |
| (20) | Photochromic compound Colored photochromic | UV VIS-IBLE | in situ formed colored photochromic melting heat from absorption | VIS-IBLE IR | Diazo salts or Azides or Nitrosamines or Organic Diazo compounds CLASS II | static visible | Initial blanket UV exposure decomposes O.R. to give latent gas bubbles. Beam I activates photochromic. Beam II is absorbed by photochromic giving local melting which forms image by expansion of latent gas bubbles. |
| (21) | Photochromic compound colored photochromic | UV VIS-IBLE | in situ formed colored photochromic melting heat from absorption | VIS-IBLE IR | Carbinol base or Pb salt with thioacentamide or alkyl thiourea Class II | static visible | Beam I colors the photochromic; Beam II strongly absorbed by colored form generates heat to cause dye formation from reaction of O.R. |

Examination of the columns headed Figure Type, in Tables I and II, gives an idea of the wide variety of endproducts which are available through this invention. The figures may be simply visable within a transparent matrix, they may be static or active figures, or alternatively they may be actual isolatable objects which can be separated from the medium in which they are formed. While the formation of figures and shapes in three-dimensions is a major value of the invention, other uses for the capacity of three-dimensional figure formation are also important, such as the optical memory store described later.

The invention attains wider scope through the variety of input mechanisms serving to define the three-dimensional figure to be produced. These input mechanisms allow control of the figure-constructing beams to facilitate rapid and simple "sketching" of three-dimensional figures from a console of instruments (useful, for example, to an architect), or alternatively they permit the rapid and automatic copying of a three-dimensional original through the use of a scanning device. Another valuable use of the invention results from coupling the beams to an appropriate computer control device capable of receiving a mathematical description of a hypothetical object (such as a turbine blade) which is then actually produced for use or experiment, or as a master for casting or other convention reproduction. By proper choice of sensitive system it is also possible to obtain a negative mould of an object, rather than a positive copy. Such a mould can be used for casting reproductions.

Whether the system chosen is of Class I using two separate species to produce the components, or of Class II using a simple specie, it is important to realize that there are always two beams and two active components present for image formation without any requirement for a reaction between the species present, if more than one.

As used herein, the word object or figure, as applied to that which is formed is meant to be taken in a broad sense as encompassing any sensible article which is visible, perceivable or detectable and, therefore, useful. In many applications of the present invention, such objects or figures will take the form of a sufficiently stable portion of the medium that it can be removed as an isolatable unit. As mentioned elsewhere, such a unit may either be an object itself or its mould counterpart. In other cases, objects may be constructed which have only a temporary remnance and which may be erased in succession so that the appearance of movement is created.

For a better understanding of the invention and its features reference should be made to the accompanying drawings and the following descriptions of specific applications.

Description of the drawings

FIGS. 3A, 2B, and 2C are process illustrations showing stages involved in one method of isolating a real solid object-figure from the medium in which it has been formed.

Detailed Description of the Figures

Figure 1:
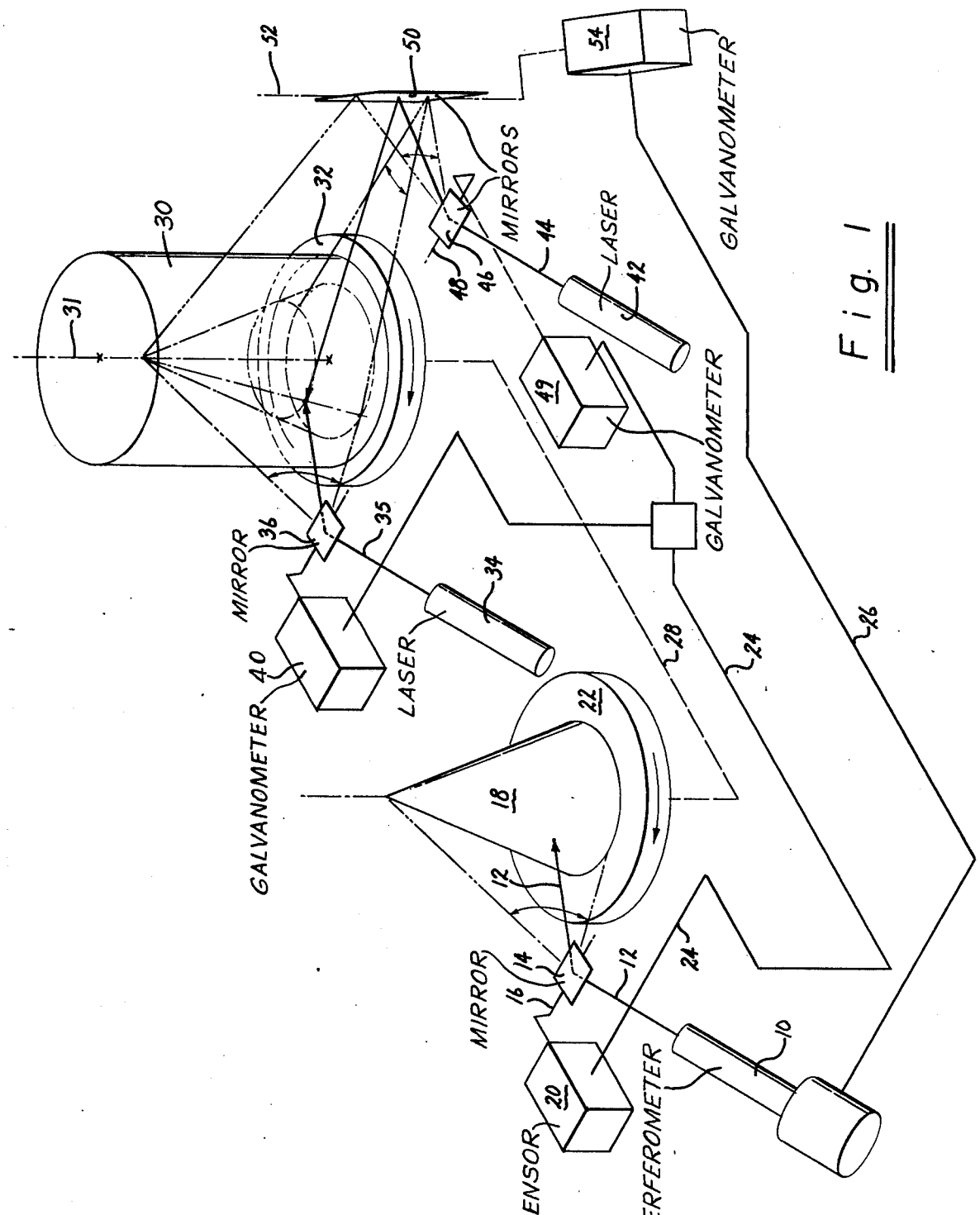
FIG. 1 is a schematic illustration depicting an embodiment of the present invention suited to the purpose of copying an original object on the same or altered scale.

Referring to FIG. 1, there is shown one form of apparatus for carrying out the present invention utilizing scanning means for developing a set of coordinate data describing the object to be reproduced and includes a non-contact gauge such as a laser interferometer 10, the output beam 12 of which is reflected from a mirror 14 arranged to pivot about axis 16 such that the laser beam is directed along a path in a vertical plane and is roughly positioned adjacent the mid section of the object 18 being scanned. A sensor 20 such as a galvanometer, supports the mirror and delivers a signal indicative of its angle of orientation. The object to be reproduced is mounted on a turntable 22 providing relative motion between itself and the laser beam. Taken together, the laser interferometer and mirror provide signals indicative of beam orientation (at 24) and beam distance (at 26) which, together with the data concerning relative rotation (at 28) of the object provides a complete description thereof in the form of coordinate data of its surface. In the apparatus of FIG. 1 this description is transferred in real time by suitable means such as conductors 24, 26, 28, to the means for forming a three-dimensional reproduction, now to be described.

The latter generally comprises a medium 30 disposed throughout a three-dimensional volume which may be rotated about an axis 31 on a turntable 32 synchronously with the rotation of the measuring turntable 22. The medium is large enough to encompass a volume in which the reproduced figure will be formed and is selected from one of those such as in Class I or Class II, previously described, which includes a first component sensitive to a first particular parameter of electromagnetic radiation and a second component sensitive to a second particular parameter of an electromagnetic wave different from said first parameter in such a manner that whenever said first and second parameters of electromagnetic energy co-act within the medium at least one of the first and second components, their reaction products, or included elements react to produce a localized detectable change in that medium which will permit the medium to become partially transformed into a sensible portion of the surface of the image being formed. Thus, a first source of electromagnetic radiation such as a laser 34 having a beam 35 is arranged to scan the medium in the same manner as the laser interferometer, that is to say, in a vertical plane passing through the medium and accordingly is directed to a mirror 36 mounted for rotation about an axis controlled by suitable sensing means 40 such as a galvanometer.

A second means for producing an electromagnetic radiation such as a laser 42 provides an output beam 44 which is deflected twice, firstly, by a mirror 46 mounted for rotation about an axis 48 and controlled by a suitable means such as a galvanometer 49 to define the level of intersection of the beam 44 with the beam 35 from the first source.

A second mirror 50 receives beam 44 as reflected from the first mirror and deflects it into the medium. The second mirror is mounted for rotation about a vertical axis 52 which defines the depth within the object within the medium at which the intersection of beams 35, 44 occur. Accordingly, the second mirror is controlled by a galvanometer 54 connected to the output of the laser gauge 10 which measures that depth.

Scanning of the object is performed line by vertical line, moving the turntable 22 to bring each new vertical segment into scanning position and synchronising rotation of turntable 32 on which the reproduction is constructed with 22. Two additional signals are sent from the scanner apparatus operating on the original to the apparatus forming the reproduction. One is the signal from the gauge 10 which gives the distance to the surface of the object, the other is the signal from the mirror 14 which gives the angle of deflection in the vertical plane. In the reproduction phase two mirrors 36, 46 are used in the vertical plane and one 50 in the horizontal plane. Both vertical mirrors 36, 46 are linked with the scanning deflector-galvanometer 20 and in real-time operation will directly reproduce the vertical angular deflection of the scanning beam 12. Mirror 50 is linked to the gauge 10 so as to reproduce at the same time the horizontal deflection required to maintain the point of beam intersection at the same distance from the central rotational axis as the corresponding distance between the scanned spot and axis of the original.

The disclosures herein of embodiments of the invention using interchange of angular values from sngle to multiple scanning devices will require coordinate transformation in order to achieve high accuracy it is submitted that a detailed illustration of such transforming means need not be shown since it is a function which can be performed by known computer devices. And, in view of the non-divergence of well-collimated laser beams, it is even possible to choose sufficiently large scanning distances (beam source to object) that the approximations inherent in the foregoing description are satisfactory.

The source or beam production means may include any source of electromagnetic or other radiation which is capable of being formed into discrete and controllable beams. Suitable sources include atomic radiation, electron beams, light of the visible, ultra-violet, or infra-red regions. The spectral selectivity, intensity, and narrow beam width attainable make the laser a specially valuable course of radiation for many purposes.

It is not necessary to have separate lasers for each beam, since a single beam can be split to give separate beams of identical or different wavelengths to match the requirements of the medium. Control of the beams may be electronic, optical, mechanical, or combinations of these, as in videotubes, Skiatron, or L.B.I.R. devices, or even simple mirror systems controlled by magnet and moving coil.

In applications involving scanning of an original object a variety of measuring devices could be used for scanning purposes, from simple mechanical probes to more sophisticated devices such as laser-based interferometers disclosed. Where their cost is not prohibitive the latter are preferred. The information detailing the coordinates of the scanned object may be stored or modified in such a way as to alter the image, as, for example, in size or proportion or in deletion or addition of particular elements.

Guidance mechanisms of any desired type may be employed for the control of infrared and ultraviolet beams. In a convenient mode of operation, the ultraviolet beam is scanned in a regular pattern, which may be continuous or stepwise, as in a conventional cathode ray tube image, except that in the present case if desired the depth dimension may be included. The main information carried can be the infrared beam, which is synchronized to intersect with the ultraviolet beam. Depending upon the fluorescent material the effect of intersection may be to stimulate or to quench emission from the fluorescing materials. The extent of the effect is determined by the infrared intensity, which is modulated as desired. When the quenching effect is used several infrared beams, or wide beams, or beams split by mirrors or prisms may be used so as to limit luminescence to a small portion of the horizontal line, or suitable fluorescent materials may be used so as to obtain this effect by scanning. If desired, the ultraviolet beam may also be guided instead of scanned so that the intersection may be used to form figures alone, and the fluorescent materials may be replaced by photochromic or thermochromic materials if appropriate beam effect devices are substituted.

In applications involving scanning of an original object a variety of measuring devices could be used for scanning purposes, from simple mechanical probes to more sophisticated devices such as laser-based interferometers disclosed. Where their cost is not prohibitive the latter are preferred. The information detailing the coordinates of the scanned object may be stored or modified in such a way as to alter the image, as, for example, in size or proportion or in deletion or addition of particular elements.

While the foregoing description of FIG. 1 has described the beam 35 as a pencil-shaped type deflected by mirror 36 to scan across the vertical plane of the medium, it should be realized that the beam 35 may be formed as a flat beam or a divergent sheet lying in the same plane. By doing so, there is a simplification of structure in that mirror 36 and galvanometer 40 need not be used. For, the desired point of activity within the media is also uniquely defined by the restriction that beam 35 lie in a well defined plane and that plane is intersected by pencil beam 44. Thus, the position information content is completely defined within these factors and the active point could as well be defined by utilizing a sheetlike beam or a feedback loop in which the position of beam 35 is determined by the elevation of beam 44, the former merely tracking along to provide for a localized co-action of the beams.

In this connection, it is important to realize that the information recorded at the junction of beam 44 with either such a sheetlike beam 34 or a pencil beam 35 does not correspond to silhouette information inasmuch as the depth information obtained with the gauge or laser interferometer 10 is inherently nonsilhouette in nature, that is to say, it is produced by relatively direct measurement impinging substantially normal to the shape or to the object being measured. In contrast, a silhouette is taken at substantially tangential to the object. This is a significant distinction because by impinging directly upon the surface, there is a greater ability to measure and distinguish cavities, protuberences, and other surface irregularities in the surface.

Figure 2:
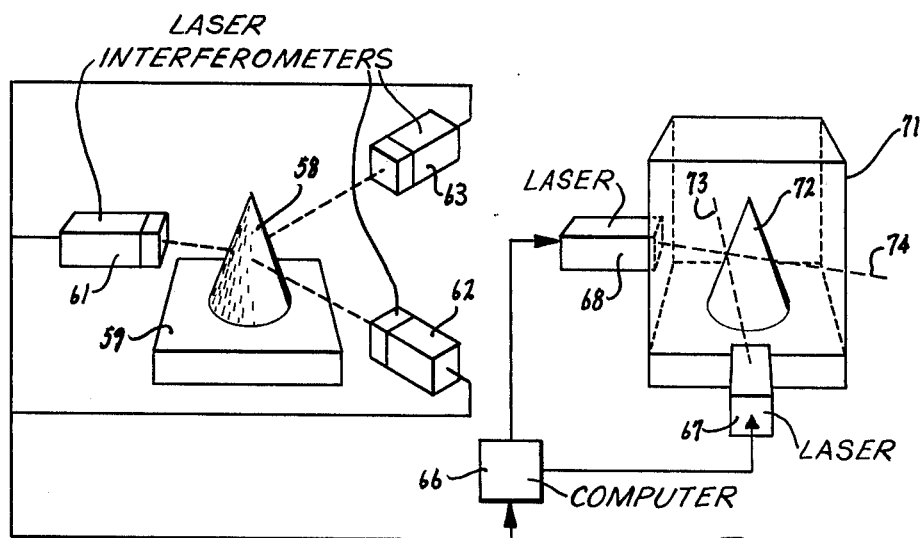
FIG. 2 is a schematic illustration depicting an alternate embodiment of the invention.

Referring now to FIG. 2, there is shown an alternative embodiment of the present invention in which the data generated by the means for measuring the surface configuration of the object 58 to be copied is delivered to the means for transferring the data, the latter including memory means 66 for accumulating the data to thereby permit two electromagnetic scanning beams to operate on a different time base from the surface measuring or data generating means. Thus, the surface measuring means comprises later interferometers 61, 62, and 63, which may be identical scanning devices connected to the input of a computer data memory 66, or integrating computer. For greatest accuracy the scanning devices are of the laserinterferometer type, such as the laser guage manufactured by Perkin-Elmer Corporation. Use of three devices permits simultaneous scanning of all sides, but it is also possible to use a single device moved between several reference points. These points can be chosen to permit scanning of cavities even in complex objects, so long as the surface is visible from some outside perspective.

The integrating computer or memory 66 contains storage capacity for the data derived from the scanners to permit virtually instantaneous scanning reproduction phase with reproduction on a slower time base. From the computer, circuits lead to lasers 67 and 68 which operate to project dissimilar beams 73, 74 through horizontal and vertical deflectors to intersect within the body of sensitive medium 71 and trace out the FIG. 72.

FIGS. 1 and 2 illustrate only particular ones of a variety of possible arrangements which will be modified according to the particular characteristics of the medium 71. In this case it is assumed that the medium is compounded with an active system in which the effect of at least one of the beams is transitory and in which the figure produced is transparent and non-interfering with the penetration of the primary and secondary construction beams 73, 74.

A variety of beam cross-sections can be employed so as to produce point intersection, or lines, or a beam may be widened so as to permit rapid generation of surfaces. If desired there may be several beams and several points of intersection on the same beam which can trace identical or different figures.

Although FIG. 2 particularly depicts a scanning apparatus suited for the determination of the surface configuration of an original solid object, other types of scanning device can be used for other types of original. For example, a variety of sonar-type devices are available which are capable of detecting interfaces of organs within living bodies. Similar effects serve to detect underground geological formations which can be effectively displayed in three dimensions through use of the invention. Alternatively the mathematical description of a hypothetical surface can be introduced directly into the computer 66 of the apparatus for realization.

To produce actual separable articles or moulds, the useful figure produced by this invention may consist of the material surrounding or contained by the image surface, rather than the image surface itself.

A number of active systems listed in Tables I and II describe mechanisms by which the figure obtained is not simply visible, but it also possesses a physical differentiation from the body of medium which allows separation. The most common of these mechanisms exploits polymerisation or cross-linking of polymers. In one use these mechanisms allow the production of simply visible images through precipitation of polymer within a solution of monomer, or, conversely, it is possible through the use of auxilliary components in the medium to obtain solid, separable figure-objects through the use of active systems which in themselves produce simply colored or opaque figures.

In the simplest technique a polymerised and cross-linked insoluble figure formed within the medium is used as a barrier to solvent action, removing in the solvent material on one or other side of the figure (interior removal gives a negative mould, exterior removal a positive copy or original). This procedure has the disadvantage that a finely detailed figure may have insufficient strength in the details to withstand such treatment.

Figures 3A, 3B, 3C:
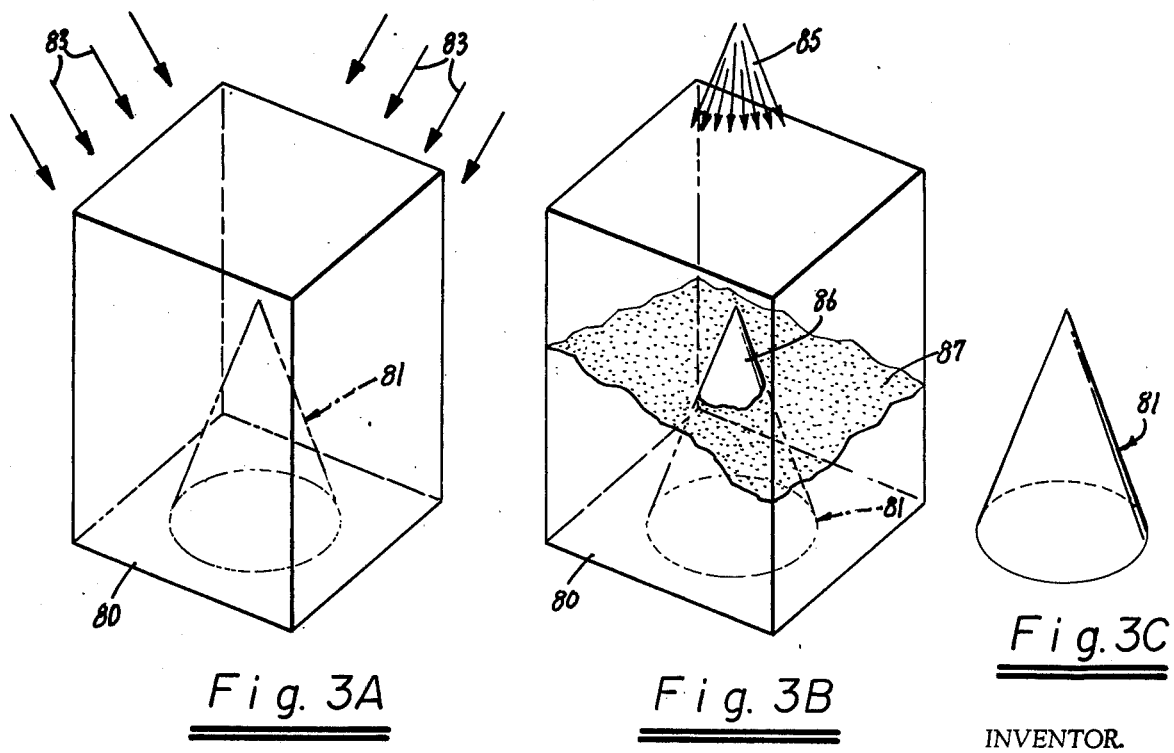

FIGS. 3A, 3B and 3C illustrate one means by which the disadvantage can be overcome, in which a body of medium within which a figure has been formed by apparatus of FIGS. 1 or 2. For this purpose, the medium incorporates an additional auxilliary photosensitive system unresponsive to the figureforming systems previously described which is activated by a specific wavelength region for which the internal figure is opaque. This auxilliary component is selected to produce cross-linking under the activating radiation if the product is to be a negative mould: alternatively the component can be chosen to destroy (or inhibit the formation of) linkages if it is desired to form a positive article. By this method the figure is distinguished by a solubility differential from its surroundings and can be separated by differential dissolution.

Referring particularly to FIGS. 3A, 3B, and 3C, the FIG. 81 is opaque to red light 83, which is used as a blanket radiation to activate linkage-destroying mechanisms through an auxilliary system incorporated in the body of medium. Thus, the figure does not allow penetration of the red light into the interior of the figure, thus protecting the interior polymer from degradation. In FIG. 3B solvent 85 is used to wash away the degraded polymer 87 exterior to the figure to permit the upper portion 86 to emerge. In FIG. 3C, the figure is isolated and available as a positive shape for direct use.

Figure 4:
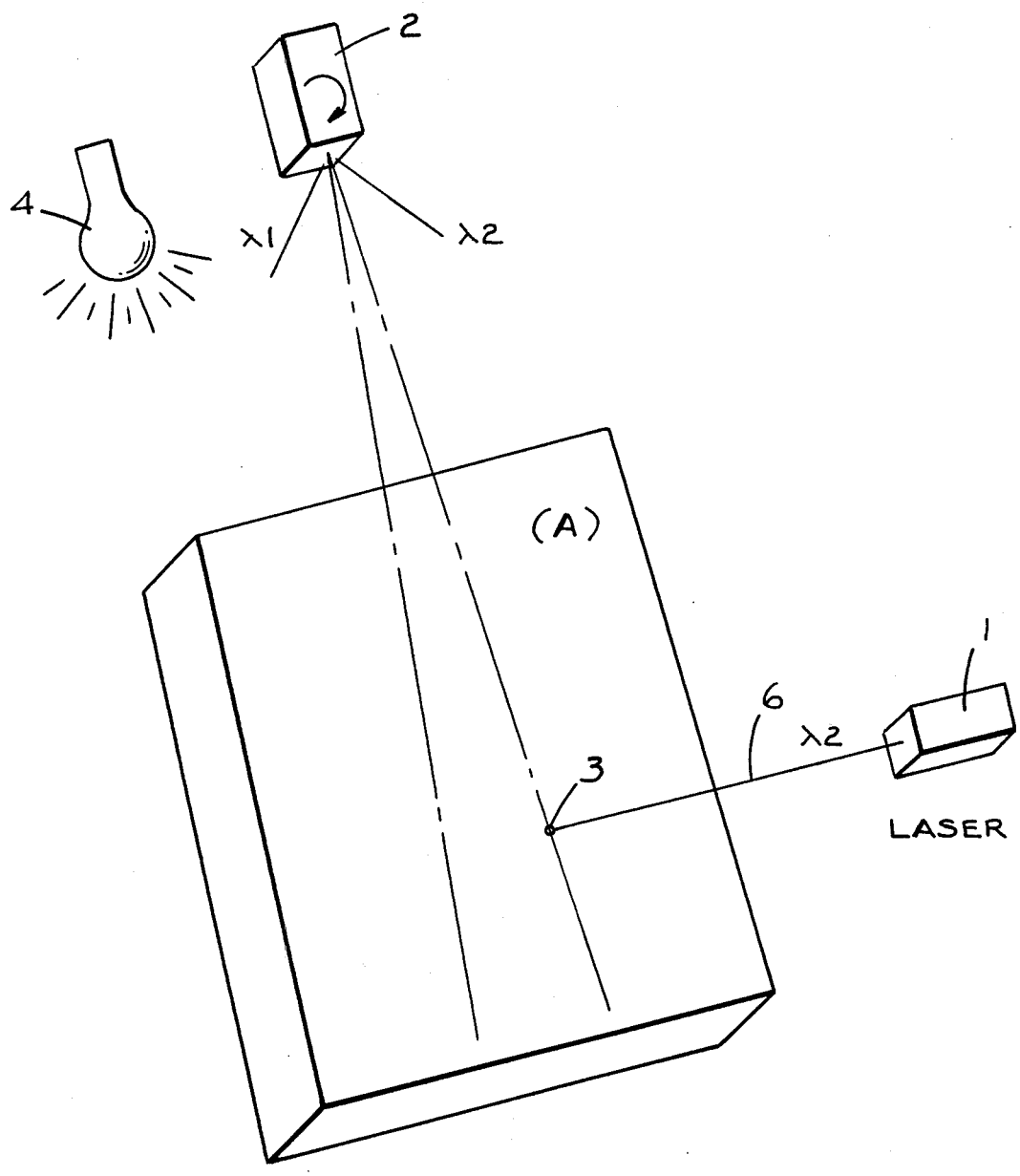
FIG. 4 is another embodiment of the subject invention in its photochromic form.

Referring to FIG. 4, a three-dimensional system for arriving at a spot within a volume of photochrommic material is illustrated by way of a two-dimensional schematic diagram for clarity. The photochromic material is chosen to be one that is normally clear. Electromagnetic radiation of an appropriate wavelength for the particular marerial used is directed at a pre-selected site 3 to change the optical state of the location within the normally transparent volume to a colored state, thus forming the desired spot. This change in the optical state is primarily a change in light absorption of a spot which may be detected by an observer with the aid of a low intensity readout light source 4, illuminating the volume of material in a manner to make the change in optical state discernible to a suitable detector, such as an observer.

A light source 1 provides a narrow collimated beam of light 6 having a band of wavelengths including $\lambda_2$. A volume of photochromic material 5 initially in its color state (A) is irradiated by the beam 6. This same volume is also partially illuminated by light from the source 2 of vavelength $\lambda_1$, disposed so that only a narrow region 3 is exposed exclusively through the $\lambda_2$ wavelength, while the remainder of the volume is exposed exclusively to $\lambda_1$ or to a combination of $\lambda_1$ and $\lambda_2$. The bleaching action of $\lambda_1$ eliminates traces of color all along the path of $\lambda_2$, leaving a spot at the position of 3. In this manner, a spot or series of spots or lines comprising a three-dimensional image can be produced.

EXAMPLE I. (Illustrating Class I media)

A low glass beaker was placed on a turntable and revolved at about 10 r.p.m. The protective glass shields from two quartz U.V. lamps were removed and by fitting shields and reflectors two narrow beams of ultraviolet near and far radiation were obtained. These beams were directed into the beaker so as to intersect at only one point near the middle. The intersection traced out a circle about 1¼ inch in diameter as the beaker was revolved. One beam was directed downward over the edge of the beaker and fitted with a filter to remove near ultraviolet light; the other passed through the glass side of the beaker so as to remove far ultraviolet light.

The medium was prepared immediately before use and was made up from 200 cc. Scott Bader C191E polyester resin, 4 grams 50% benzoyl peroxide catalyst paste, and 0.4 grams resorcinol monobenzoate. These were thoroughly mixed, poured into the revolving beaker, and the U.V. lights turned on. After about three hours exposure the lamps were removed and the beaker flooded with tetrahydrofuran. Soluble material on all sides, above and below the figure was washed away, leaving a soft, tire-shaped object suspended in the solvent. The figure was removed and subjected to ultraviolet exposure on a plate for another hour to obtain a fully polymerised, rigid object.

In this example polyester resin served as the first component, subject to slow polymerisation under the influence of near ultraviolet radiation in the presence of the catalyst benzoyl peroxide.

The second component, resorcinol monobenzoate, acted as an accelerator for the polymerisation reaction when under the influence of far ultraviolet. The object figure formed in the region swept by both beams at their intersection within the volume of medium and was characterised by a relative insolubility compared to the bulk of the medium volume.

EXAMPLE 2. (Illustrating Class II media)

Ten grams of beta-tetrachlorketonaphthalene was stirred into 100 cc. carbon tetrachloride and the solution was poured into a narrow cell formed from two 4 × 5 glass plates supported by four strips of ultraviolet transmitting quartz so that a gap about 2 mm. was left between them. The cell was placed in a horizontal position where an ultravilolet beam could be directed through one of the shorter sides into the body of medium. An infra-red lamp was directed onto the top surface of the cell, masked in such a way that the center of the cell was shielded from the infra-red, but the regions near both the entry point and the exit point of the ultraviolet beam were irradiated by the infra-red. Through the combined action of the two beams on the cell there was obtained a freestanding region of red coloration in the center of the cell. By removing the mask protecting the central part of the cell from the infra-red the visible red line could be erased.

EXAMPLE 3. (illusrating use of the figure as an internal filter to obtain a solid figure or mould)

A thin walled glass tube was corked at one end and placed upright on a turntable. Three 1 mm. beams of light were obtained from three 250 watt projector lamps and projected horizontally and at 45° above and below the horizontal, to intersect in the center of the tube. The medium was prepared by mixing 50 cc. C191E polyester resin, 1 gm. benzoyl peroxide paste, 10 grams indole, and 5 grams carbon tetraiodide. The last components were first mixed with a little styrene and the whole stirred with gentle warming. The medium was exposed under rotation for about 10 minutes, until the reddish-brown spherical figure in the center of the medium was opaque. During exposure a fan was used to blow cooled air onto the vessel to prevent overheating. When the internal figure was satisfactory the medium was illuminated from above by a 120 watt mercury lamp for about 80 minutes while removing all visible light with a Kodak 18A ultraviolet transmitting filter. When the resin was hard to the touch the glass tube was broken and it was found that the entire medium had been polymerised with the exception of a cylindrical region opposite to the image from the U.V. lamp, which had been protected through the action of the opaque figure acting as an internal mask.

EXAMPLE 4

A syrup of polyester resin was prepared as in Example 1, and poured into a one liter beaker painted black on the outside. The beaker was placed beneath a lens 8 inches in diameter, of three inches focal length, which was supported horizontally and covered with a blue plastic sheet. The assembly was placed outside at midday, and the beaker was adjusted to receive the image of the sun at a depth of about one inch. After 45 minutes exposure tetrahydrofuran was used to wash away the remaining syrup and a figure was isolated as in Example 1. The figure was slightly elongated due to the scanning movement of the image within the medium during the period of exposure.

EXAMPLE 5

15 grams of samarium-cerium activated strontium sulphide phosphor powder (known as infrared sensitive phosphor) were suspended in one liter anhydrous solvent and stirred vigorously, then allowed to settle.

When the heavier particles had settled out the slightly cloudy supernatant suspension was taken to a darkened room and stirred and irradiated with infrared light until no further luminescence could be observed (about 15 hours). Under a green safelight the medium was poured into a square glass cell constructed of ultraviolet transmitting glass. Through one face of the cell there was transmitted a narrow ultraviolet beam obtained as in Example 1, and through the adjacent face there was projected a similar beam of infrared light. A free-standing point of green fluorescence was thus obtained, which could be erased by agitating the medium, then reproduced when the medium was no longer in motion. As this phosphor can also be made sensitive to infrared radiation through the action of alphaparticles, it would be possible to replace the ultraviolet beam with a suitable radioactive source.

While the tables and described examples of embodiments are representative of components and uses to which the invention may be put, they should not be considered limiting. The parameters of beam characteristics (wavelength, particle radiaton, heating effect, etc.), the shape of beam intersection (point, plane-formed-by moving-line, point effect from a beam "drawing" on a plane, line from intersecting planes, etc.), intensity of beam, and speed of beam movement, as well as the characteristics of desired three-dimensional figures (permanant or transitory visible, moving visible, permanent extractable or separable figures, non-visible but detectable figures as used in the computer memory), and the various types of reactive systems of both Class I and II, can be combined in a great number of ways for different ends. Any particular commercial application will undoubtably require optimization of particular elements of the instrumentation or active system complex. Therefore tables and embodiments disclosed herein are intended only to demonstrate a few of the range of mechanisms which can be adapted for use in the invention and to exemplify the characteristics which make particular types of system useful for attaining some traditional and other entirely novel functions in the creation, control and use of three-dimensional figures obtained through the practice of this invention.

I claim:

1. A method of generating a three-dimensional pattern in a volume of material comprising the steps of:
  a. generating control signals specifying the coordinate positions of a plurality of points within a volume of material which is capable of undergoing a change in optical properties in response to energy level changes within said volume, and
  b. generating in response to said control signals energy level changes which cooperate within said volume at selected locations therein corresponding to said coordinate positions to produce the simultaneous visual display of said plurality of points.

2. A method of generating a pattern containing three-dimensional information in a medium of material comprising the steps of:
  a. producing control signals specifying the coordinate positions of a plurality of points of a three-dimensional pattern; and
  b. generating, in response to said control signals and within a medium of material which is capable of undergoing a change in optical properties in response to energy level changes within said medium, energy level changes which cooperate within said medium to produce therein an optical pattern representing a three-dimensional display of said plurality of points.

3. A method as defined in claim 2 wherein said generating step further comprises:
  a. generating first and second radiations having at least two different radiation states; and
  b. directing said radiations onto said medium so that they cooperate therein to produce said optical pattern.

4. A method of generating a three-dimensional pattern in a volume of material comprising the steps of:
  a. generating at least two radiations within respective ones of two distinct wavelength ranges, which radiations cause the volume of material to undergo a change in optical properties so as to exhibit at least two discernibly different states, and
  b. directing said two radiations into said volume of material to cooperate at selected locations corresponding to the coordinate positions of a plurality of points to produce the simultaneous visual display of said plurality of points.

5. A method as recited in claim 4 further comprising the step of directing said two radiations into said material to cooperate at selected locations corresponding to at least the approximate coordinate positions of a line.

6. A method as recited in claim 5 wherein the step of directing said two radiations to cooperate at selected locations corresponding to the coordinate positions of a line includes the step of continuously sweeping said two radiations in cooperative relationship one with the other.

7. A method as recited in claim 6 further comprising the step of blanking at least one of said two radiations to terminate said line.

8. A three-dimensional pattern generator comprising:
  a. a medium which is capable of undergoing a change in optical properties in response to energy level changes within said medium;
  b. means for generating within said medium said changes in energy levels; and
  c. computing and control means for receiving input data specifying the coordinate positions of a plurality of points of a three-dimensional pattern and for computing control signals from said data, said generating means being responsive to said control signals to cause said changes in energy levels to cooperate within said medium to produce therein an optical pattern representing the three-dimensional display of said three-dimensional pattern.

9. A three-dimensional dimensional pattern generator as defined in claim 8 wherein said optical pattern is a visible real three-dimensional display of said plurality of points.

10. A three-dimensional pattern generator as defined in claim 9 wherein:
  a. said change in optical properties causes said medium to exhibit at least two discernibly different optical states and wherein said medium is responsive to radiation having at least two distinct radiation states to produce said change in optical properties; and
  b. said generating means comprises:
    1. radiation means for generating at least two radiations having respective ones of said radiation states; and
    2. means for directing the radiations from said radiation means into said medium wherein said medium is caused to pass between said two discernibly different states under the cooperative effect of said two radiations; and 3. said directing means is responsive to said control signals to direct said two radiations from said radiation means into said medium to cooperate therein and produce therein an optical pattern of said two discernibly different optical states, said optical pattern representing a three-dimensional display of said plurality of points.

11. A pattern generator as defined in claim 10 wherein said medium is a volume of material and said two discernibly different optical states are a ground state and an excited state, and said two different radiation states are two different wavelengths in the light specturm, whereby the cooperative action of said radiations causes said material to be selectively raised to said excited state at selected locations corresponding to said plurality of points, from which locations visible radiations is emitted due to the transition of said material from said excited state to said ground state, thereby producing in said volume a real three-dimensional display of said plurality of points.

12. A pattern generator as defined in claim 10 wherein said control signals comprise:
  a. a first control signal for controlling a first of said radiations in a direction corresponding to two coordinates of each of said points; and
  b. a second control signal for controlling the second of said radiations in a direction corresponding at least to the third coordinate of each point.

13. A three-dimensional pattern generator comprising:
  a. a volume of material which is capable of undergoing a change in optical properties in response to energy level changes within the said volume,
  b. directional means for generating within said volume said changes in energy levels, and
  c. computing and control means for receiving input data specifying the coordinate positions of a plurality of points and computing therefrom control signals, said directional means being responsive to said control signals to cause said changes in energy levels to cooperate within said volume of material at selected locations therein corresponding to the coordinate positions of said plurality of points.

14. A pattern generator as recited in claim 13 further comprising means for erasing a spot displayed in said volume.

15. A pattern generator as defined in claim 13
  a. wherein said volume responds to the intersections of a pair of electronic beams to cause said energy level changes,
  b. and wherein said directional means comprises:
    1. means for generating a pair of electronic beams, and
    2. beam directing means for directing at least one of said electronic beams to cause them to cooperate within said volume at said selected locations.

16. A pattern generator as defined in claim 15 wherein said volume responds to the intersections of electron beams in space, and wherein said generating means comprises means for generating a pair of electron beams in space.

17. A pattern generator as recited in claim 13 wherein said computing and control means comprises:
  a. a display computer for receiving said input data and providing outputs for each of said plurality of points, said outputs defining said control signals,
  b. a display memory for storing said outputs from said display computer, said display memory being connected to said directional means to transmit thereto said control signals, and
  c. control means connected to said display computer, and to said display memory for controlling the transfer of said outputs to said display memory and for causing said control signals to be periodically read out of said display memory to said directional means.

18. A pattern generator as recited in claim 17 further comprising an analog computer for computing the control signals.

19. A pattern generator as recited in claim 17 wherein said computing and control means further comprises a manual input means for inputting data and commands to said display computer.

20. A pattern generator as recited in claim 17 further comprising means for erasing a spot displayed in said volume.

21. A three-dimensional pattern generator comprising:
  a. a volume of material which is capable of undergoing a change in optical properties so as to exhibit at least two discernibly different states and responsive to radiation having at least two distinct radiation states to produce said change in optical properties,
  b. radiation means for generating at least two radiations having respective ones of said radiation states,
  c. means for directing the radiations from said radiation means into said volume of material wherein said material is caused to pass between said two discernibly different states under the cooperative effect of said two radiations, and
  d. computing and control means for receiving input data specifying the coordinate positions of a plurality of points, and computing therefrom direction control signals, said directing means being responsive to said direction signals to direct said two radiations from said radiation means within said volume of material to cooperate at selected locations corresponding to the coordinate positions of said plurality of points.

22. A pattern generator as defined in claim 21 wherein said two radiations are two rays of a single radiation beam and said two distinct radiation states are two different propagation vectors of the two respective rays, and wherein said material is thermochromic material, and further comprising means for focusing said single radiation beam at said selected locations.

23. A pattern generator as defined in claim 21 wherein said radiation means comprises a thermal light source.

24. A pattern generator as recited in claim 21 wherein said radiation means comprises coherent light source means.

25. A pattern generator as recited in claim 24 wherein said radiation means comprises at least one laser that generates said at least two radiations.

26. A pattern generator as recited in claim 24 wherein said radiation means comprises two lasers each generating a respective one of said at least two radiations.

27. A pattern generator as defined in claim 21 wherein said two distinct radiation states are two different wavelengths in the light spectrum.

28. A pattern generator as recited in claim 27 wherein said computing and control means includes line generating means for receiving data that define a line which is to be displayed within said volume of material and computing therefrom line deflection control signals, said directing means being responsive to said line deflection control signals for directing the radiations from said radiation means within said material to cooperate at selected locations corresponding to at least the approximate coordinate positions of said line.

29. A pattern generator as defined in claim 18 further comprising means responsive to the line-defining data for repeatedly directing said radiations in sequence along the co-ordinate positions of the line to be displayed.

30. A pattern generator as recited in claim 21 wherein said material exhibiting at least two discernibly different states includes material with at least two nonradiation emissive discernible states.

31. A pattern generator as recited in claim 30 wherein one of said discernibly different states is substantially optically clear while the other of said discernibly different states is a substantially darkened optical state.

32. A pattern generator as recited in claim 31 wherein said volume of material includes a volume of photoreversible photochromic material.

33. A pattern generator as recited in claim 31 wherein said volume of material includes a volume of thermochromic material.

34. A pattern generator as recited in claim 21 wherein said material exhibiting at least two discernibly different stages includes material with at least one radition-emitting discernible state.

35. A pattern generator as recited in claim 34 wherein said material is capable of existing in a ground state and in at least one excited state, whereby said material is selectively raised to said excited state by the cooperative action of said two radiations from said radiation means as said selected locations from which radiation is emitted due to the transition of said medium from said excited state to a lower state.

36. A pattern generator as recited in claim 35 wherein said volume of material is composed of a suspension of particles of a phosphor, said phosphor being capable of being excited by one of said two radiations from said radiation means and further excited by the other of said two radiations.

37. A pattern generator as recited in claim 34 wherein said material is capable of existing in a ground state and in at least two excited states and wherein the energy of one of said two radiations from said radiation means corresponds to the transition of said material from said ground state to a first excited state while the energy of the radiation from the other of said two radiations is sufficient to raise said material to a second excited state after it has been raised to said first excited state, whereby said material is selectively excited by the cooperative effect of said two radiations from said radiation means to said second state at said selected locations from which radiation is emitted due to the transition of said material from said second excited state to a lower state.

38. A pattern generator as recited in claim 37 wherein said material is composed of a fluid including particles dispersed throughout said volume which are each capable of existing in a ground state and a plurality of excited states.

39. A pattern generator as recited in claim 37 wherein said material is a gaseous substance.

40. A pattern generator as defined in claim 21 wherein said direction control signals are digital deflection signals, and wherein said directing means comprises radiation deflection means.

41. A pattern generator as recited in claim 40 wherein said deflection means comprises an electro-optic deflector.

42. A pattern generator as recited in claim 40 wherein said deflection means comprises an acoustic-optical light deflector.

43. A pattern generator as recited in claim 40 wherein said deflection means includes digital deflection means for producing deflection of at least one of said two radiations directly in response to said digital deflection control signals.

44. A pattern generator as recited in claim 40 wherein said deflection means comprises Galvanometer-mirror deflectors.

45. A pattern generator as recited in claim 44 wherein said Galvanometer-mirror deflectors comprise:
  a. at least one mirror for reflecting each of said two radiations,
  b. a Galvanometer movement for each mirror, said mirrors being mechanically attached for pivotal displacement with the coils of said movements, and
  c. A digital-to-analog converter for converting said digital deflection control signals to proportional electrical currents, said currents being supplied to said coils to thereby produce a displacement of said mirrors and a resulting deflection of said radiations.

46. A method of generating a three-dimensional pattern within a volume of photoreversible photochromic material which may be caused to pass from a substantially clear optical state to a darkened optical state upon the application of darkening radiation and also which may be caused to pass from the darkened optical state into a substantially clear optical state by application of bleaching radiation, comprising the steps of:
  scanning a bleaching radiation beam having a sharp intensity cut off at its trailing edge through at least a portion of said volume of material, and
  passing a darkening radiation beam through the volume of material flooded with the bleaching radiation beam to the trailing edge thereof, whereby darkened spots may be successively formed in various preselected locations within said volume where the darkening radiation beam intersects with the trailing edge of the bleaching radiation beam.

47. A method according to claim 46 wherein the step of passing a darkening radiation beam includes passing a narrow collimated darkening radiation beam through the volume of material flooded with the bleaching radiation beam to the trailing edge thereof.

48. A three-dimensional display system, comprising:
  a volume of photoreversible photochromic material having at least two discernibly different optical states wherein said material may be caused to pass from a substantially clear optical state to a darkened optical state by application of darkening optical electromagnetic radiation within a first range of wavelengths, and wherein said material may be caused to pass from a darkened optical state to a substantially clear optical state by application of bleaching optical electromagnetic radiation within a second distinct band of wavelengths, and
  display means cooperatively associated with said volume of material for simultaneously applied to said volume radiation intensity of both darkening and bleaching radiation to generate darkened spots in at least two preselected locations within said volume.

49. A three-dimensional display system according to claim 48 wherein said display means includes means to form and direct simultaneously said darkening radiation in at least two beams to said at least two preselected locations within said volume of material.

50. A three-dimensional display system according to claim 48, wherein said display means additionally includes means for flooding with bleaching radiation at least those portions of the volume of material through which said at least two beams of darkening radiation pass prior to reaching said preselected locations.

51. A three-dimensional display system, comprising:
a volume of photoreversible photochromic material having at least two discernibly different optical states wherein said material may be caused to pass from a substantially clear optical state to a darkened optical state by application of darkening optical electromagnetic radiation within a first range of wavelengths, and wherein said material may be caused to pass from darkened optical state to a substantially clear optical state by application of bleaching optical electromagnetic radiation within a second distinct band of wavelengths, and
display means cooperatively associated with said volume of material for simultaneously applying to said volume radiation intensity of both darkening and bleaching radiation to generate a darkened spot at a preselected location within said volume.

52. A three-dimensional display system according to claim 51 wherein said display means includes:
means for flooding bleaching radiation through something less than full volume of material in a beam with sharp intensity cut off on at least one surface thereof, and
means for directing a beam of darkening radiation through that portion of the volume of material flooded by said bleaching radiation flooding means to intersect with a surface of said bleaching radiation beam at which there is a sharp intensity cut off from within the beam, thereby forming a darkened spot at said intersection.

53. A three-dimensional display system according to claim 52 which additionally comprises means for scanning said bleaching radiation beam and said darkening radiation beam cooperatively through the volume of material to form a series of darkened spots at a series of preselected locations.

54. A three-dimensional display system according to claim 53 wherein said volume of photochromic material exhibits greater radiation absorption of said darkening radiation in said material's darkened optical state than in said material's clear optical state.

55. A three-dimensional display system according to claim 51 wherein said display means includes means to form and direct said darkening radiation in beam to said preselected location within said volume of material.

56. A three-dimensional display system according to claim 55 wherein said display means additionally includes means for flooding with bleaching radiation at least that portion of the volume of material through which said beam of darkening radiation passes prior to reaching said preselected location.

57. A three-dimensional display system according to claim 56 wherein said volume of material exhibits greater adsorption of the darkening radiation in said material's darkened optical state than in said material's clear optical state.

58. A three-dimensional display system according to claim 56 wherein said display means includes additional means for flooding with bleaching radiation in regions beyond said preselected location through which said beam of darkening radiation passes.

59. A three-dimensional display system according to claim 56 wherein said display means additionally includes means for flooding the entire volume with bleaching radiation of an intensity sufficient to bleach any prior display before forming a new display.

60. A three-dimensional pattern generator, comprising:
A volume of material having at least two discernibly different non-radiation emissive states and responsive to radiation intensity within at least two distinct wavelength ranges, wherein said material passes from a first to a second of said stages upon application of radiation within a first of said distinct wavelength ranges, and wherein said material passes from the second to the first of said states upon application of radiation within a second of said distinct wavelength ranges, and
pattern generation means cooperatively associated with said volume of material for simultaneously applying controlled levels of radiation intensity within the first and second of said distinct wavelength ranges to generate a discernible spot at a preselected location within said volume of material.

61. A three-dimensional pattern generator according to claim 60, wherein said volume of material includes a volume of photoreversible photochromic material.

62. A three-dimensional pattern generator according to claim 61 wherein said first state is substantially optically clear.

63. A three-dimensional pattern generator according to claim 60 wherein said material has at least two discernibly different states, said states being at least two discernibly different optical states.

64. A three-dimensional pattern generator according to claim 63 wherein said radiation intensity includes electromagnetic radiation intensity.

65. A three-dimensional pattern generator according to claim 60 wherein said pattern generation means includes means to form and direct a beam of radiation within said first wavelength range to said preselected location within said volume of material.

66. A three-dimensional pattern generator according to claim 65 wherein said pattern generation means additionally includes means for flooding with radiation of said second wavelength range at least portions of said volume of material through which said beam within said first wavelength range passes before reaching said predetermined location.

67. A three-dimensional pattern generator according to claim 66 wherein said volume of material has at least two discernibly different states, said states being at least two discernible optical states.

68. A three-dimensional pattern generator according to claim 60 which additionally comprises readout radiation means for illuminating the volume of material to detect the non-radiation emissive state of the preselected location within said volume of material.

69. A three-dimensional pattern generator according to claim 68 wherein said pattern generation means includes means for bringing radiation within said first wave-length range to a focus at said pre-selected location within said volume of material.

70. A three-dimensional pattern generator according to claim 69 wherein the pattern generation means additionally includes means for flooding with radiation of said second distinct wavelength range at least regions within the volume of material through which said radiation beam of the first wavelength range passes before reaching said preselected location.

71. A pattern generator according to claim 70 wherein the pattern generator means additionally includes means for scanning said radiation of first and second wavelength ranges throughout the volume of material to form a succession of discernible spots.

72. A three-dimensional pattern generator according to claim 70 wherein said volume of material having at least two discernibly different states includes a volume of material having at least two discernibly different optical states.

* * * * *

UNITED STATES PATENT AND TRADEMARK OFFICE
CERTIFICATE OF CORRECTION

PATENT NO. : 4,041,476
DATED : August 9, 1977
INVENTOR(S) : Wyn Kelly Swainson

It is certified that error appears in the above–identified patent and that said Letters Patent are hereby corrected as shown below:

Column 10, delete lines 19-28 which duplicate lines 53-62.

Signed and Sealed this

Twentieth Day of November 1979

[SEAL]

Attest:

RUTH C. MASON
Attesting Officer

LUTRELLE F. PARKER
Acting Commissioner of Patents and Trademarks

UNITED STATES PATENT AND TRADEMARK OFFICE
CERTIFICATE OF CORRECTION

PATENT NO. : 4,041,476
DATED : August 9, 1977
INVENTOR(S) : Wyn Kelly Swainson

It is certified that error appears in the above—identified patent and that said Letters Patent are hereby corrected as shown below:

On the Cover page add:

--[30] Foreign Application Priority Data

July 12, 1967        Denmark        3611/67

Signed and Sealed this

Eighth Day of April 1980

[SEAL]

Attest:

SIDNEY A. DIAMOND

Attesting Officer        Commissioner of Patents and Trademarks